US012638495B2

(12) United States Patent
Priddle et al.

(10) Patent No.: US 12,638,495 B2
(45) Date of Patent: May 26, 2026

(54) FIXTURING ASSEMBLY AND METHOD FOR TESTING, CALIBRATING, AND VALIDATING HIGH SPEED RADIO FREQUENCY SIGNALS ON FLEXIBLE PRINTED CIRCUITS

(71) Applicant: Ciena Corporation, Hanover, MD (US)

(72) Inventors: Joel Priddle, Kanata (CA); Dave D'Aoust, Westmeath (CA); Olivier Thibault-Maheu, Quebec (CA); Mathieu Daviault, Quebec (CA)

(73) Assignee: Ciena Corporation, Hanover, MD (US)

( * ) Notice: Subject to any disclaimer, the term of this patent is extended or adjusted under 35 U.S.C. 154(b) by 171 days.

(21) Appl. No.: 18/643,143

(22) Filed: Apr. 23, 2024

(65) Prior Publication Data

US 2025/0327850 A1 Oct. 23, 2025

(51) Int. Cl.
*G01R 31/28* (2006.01)
*G01R 1/04* (2006.01)
*G01R 1/067* (2006.01)

(52) U.S. Cl.
CPC ....... *G01R 31/2808* (2013.01); *G01R 1/0408* (2013.01); *G01R 1/06772* (2013.01)

(58) Field of Classification Search
None
See application file for complete search history.

(56) References Cited

U.S. PATENT DOCUMENTS

| | | | | |
|---|---|---|---|---|
| 8,044,673 B1 * | 10/2011 | Burgyan | .............. | G01R 1/0466 |
| | | | | 324/750.16 |
| 2007/0164770 A1 * | 7/2007 | Casler, Jr. | ............ | G05B 13/048 |
| | | | | 324/754.03 |
| 2009/0128178 A1 * | 5/2009 | Matsuzawa | ........ | G01R 31/2891 |
| | | | | 324/762.05 |
| 2012/0274346 A1 * | 11/2012 | Nickel | ..................... | G01R 1/07 |
| | | | | 324/754.03 |
| 2013/0044033 A1 * | 2/2013 | Nickel | ................... | G01R 29/10 |
| | | | | 343/703 |
| 2019/0014657 A1 * | 1/2019 | Miyazaki | ............. | H05K 1/0271 |
| 2023/0359024 A1 * | 11/2023 | Izawa | ..................... | H01L 23/20 |

* cited by examiner

*Primary Examiner* — Jas A Sanghera
(74) *Attorney, Agent, or Firm* — Clements Bernard Walker; Christopher L. Bernard

(57) ABSTRACT

A fixturing assembly and method including and utilizing: a component holder adapted to receive and retain a component including a component flexible printed circuit including component radio frequency electrical signal contacts; a test printed circuit board/flexible printed circuit including test radio frequency electrical signal contacts; and a clamping mechanism adapted to be actuated to compress the component radio frequency electrical signal contacts into the test radio frequency electrical signal contacts during radio frequency electrical signal testing of the component. In an embodiment, the clamping mechanism includes a clamping arm that is selectively actuated to be disposed adjacent to an interface between the component radio frequency electrical signal contacts and the test radio frequency electrical signal contacts and to compress the component radio frequency electrical signal contacts into the test radio frequency electrical signal contacts during the radio frequency electrical signal testing of the component.

20 Claims, 11 Drawing Sheets

108

100a 102, 104

100

106

108

100b 102, 104

106

FIXTURING ASSEMBLY AND METHOD FOR TESTING, CALIBRATING, AND VALIDATING HIGH SPEED RADIO FREQUENCY SIGNALS ON FLEXIBLE PRINTED CIRCUITS

TECHNICAL FIELD

The present disclosure relates generally to the optical networking and telecommunications fields. More particularly, the present disclosure relates to a fixturing assembly and method for testing, calibrating, and validating high speed radio frequency (RF) signals on flexible printed circuits (FPCs).

BACKGROUND

In the optical networking and telecommunications fields, it is often necessary to test, calibrate, and validate components, such as high bandwidth coherent driver modulators (HB-CDMs), intradyne coherent receivers (ICRs), and the like, that include FPC interfaces for high speed RF electrical connections, as well as direct current (DC) electrical connections, under controlled thermal conditions. For the sake of convenience, as used here, testing, calibrating, and validating are collectively referred to simply as testing. In order to perform such testing, the high speed RF electrical connections associated with the printed circuit board (PCB) of a fixturing assembly are typically made at the FPC interfaces via soldering, spring loaded pogo pins, or a stop block against which the FPC interfaces are cornered. In general, these testing and fixturing assemblies and methodologies lead to possible FPC damage, are time consuming, and are prone to signal integrity degradation. For example, soldering and desoldering are time consuming and labor intensive and may lead to FPC wear and damage, requiring increased component quality control monitoring. Spring loaded pogo pins are difficult to align, suffer from signal integrity degradation, and may dent an FPC, creating a weak spot prone to subsequent delamination. Cornering the FPC interfaces against a stop block suffers from FPC interface alignment problems due to tolerance stack up errors and may also lead to FPC wear and damage. The high speed RF testing of a component may be performed before a FPC is attached, but then the FPC itself is not tested, potentially causing a bad component to subsequently be delivered.

Further, conventional testing and fixturing assemblies and methodologies do not allow for RF switching higher than 70 GHZ, which requires an excessive number of test heads and PCB channels to be utilized in some high speed applications.

The present background is provided as environmental context only. It will be readily apparent to those of ordinary skill in the art that the principles and concepts of the present disclosure may be implemented in other fields and environmental contexts equally, without limitation.

BRIEF SUMMARY

The present disclosure provides a mechanical fixturing assembly and method for testing components with FPC interfaces that are coupled to high speed RF electrical connections, more permanently in operation, but more temporarily during testing, avoiding the use of solder, spring loaded pogo pins, stop blocks, etc. that may lead to FPC damage, are time consuming and labor intensive to implement, and are prone to signal integrity degradation. This fixturing assembly and method use a dry compression contact mechanism that couples the RF electrical contacts of the FPC to the RF electrical contacts of the PCB of the fixturing assembly in a temporary, robust, and high throughput manner. DC electrical connections may also be provided, as well as component thermal and humidity control, such that optimized testing conditions may be established.

Contact alignment is precisely controlled. The component and FPC and/or fixturing assembly and PCB may be aligned and realigned, such that RF signal switching is possible. This means that a reduced number of test heads and PCB channels can be utilized in some applications. Dry compression contact mechanism actuation and fixturing assembly alignment and realignment are implemented via computer control and a pneumatic, mechanical, or electromechanical stage, as well as robotic vision technologies, meaning that high throughput autonomous testing routines may be carried out without manual operator intervention.

In one embodiment, the present disclosure provides a fixturing assembly including: a component holder adapted to receive and retain a component including a component FPC including component RF electrical signal contacts; a test PCB or test FPC including test PCB/FPC RF electrical signal contacts (or landing pads); and a clamping mechanism adapted to be actuated to compress the component RF electrical signal contacts into the test PCB/FPC RF electrical signal contacts during RF electrical signal testing of the component. Optionally, the component holder defines a recess adapted to receive and retain the component. The fixturing assembly also includes a DC electrical connection adapted to contact a DC electrical contact of the component adjacent to or through the component holder. The fixturing assembly further includes RF test heads coupled to the test PCB/FPC RF electrical signal contacts and adapted to perform the RF electrical signal testing of the component. The fixturing assembly further includes an alignment stage adapted to translate the test PCB/FPC with respect to the component FPC to align the test PCB/FPC RF electrical signal contacts with respect to the component RF electrical signal contacts. The alignment of the test PCB/FPC RF electrical signal contacts with respect to the component RF electrical signal contacts is controlled by a computer controller and a camera assembly utilizing an automated computer vision algorithm. In an embodiment, the clamping mechanism includes a clamping arm that is selectively actuated to be disposed adjacent to an interface between the component RF electrical signal contacts and the test PCB/FPC RF electrical signal contacts and to compress the component RF electrical signal contacts into the test PCB/FPC RF electrical signal contacts during the RF electrical signal testing of the component. Optionally, an interposer material is disposed between the component RF electrical signal contacts and the test PCB/FPC RF electrical signal contacts during the RF electrical signal testing of the component. The fixturing assembly further includes a thermal head thermally coupled to the component holder and adapted to control the temperature of the component holder and the component during the RF electrical signal testing of the component. In an embodiment, the RF electrical signal testing of the component is carried out in multiple sequences, each sequence involving a translation of the test PCB/FPC with respect to the component FPC under test and a compression/release cycle of the clamping mechanism.

In another embodiment, the present disclosure provides a method for the RF electrical signal testing of a component, the method including: receiving and retaining the component including a component FPC including component RF electrical signal contacts at a component holder of a fixturing assembly, where the fixturing assembly includes a test PCB or test FPC including test PCB/FPC RF electrical signal contacts (or landing pads); compressing the component RF electrical signal contacts into the test PCB/FPC RF electrical signal contacts using a clamping mechanism of the fixturing assembly; and conducting RF electrical signal testing of the component. The method also includes contacting a DC electrical contact of the component with a DC electrical connection of the fixturing assembly adjacent to or through the component holder. The RF electrical signal testing of the component is conducted using RF test heads coupled to the test PCB/FPC RF electrical signal contacts. The method further includes translating the test PCB/FPC with respect to the component FPC to align the test PCB/FPC RF electrical signal contacts with respect to the component RF electrical signal contacts using an alignment stage of the fixturing assembly. The alignment of the test PCB/FPC RF electrical signal contacts with respect to the component RF electrical signal contacts is controlled by a computer controller and a camera assembly of the fixturing assembly utilizing an automated computer vision algorithm. In an embodiment, the clamping mechanism includes a clamping arm that is selectively actuated to be disposed adjacent to an interface between the component RF electrical signal contacts and the test PCB/FPC RF electrical signal contacts and to compress the component RF electrical signal contacts into the test PCB/FPC RF electrical signal contacts during the RF electrical signal testing of the component. Optionally, an interposer material is disposed between the component RF electrical signal contacts and the test PCB/FPC RF electrical signal contacts during the RF electrical signal testing of the component. The method further includes controlling the temperature of the component holder and the component during the RF electrical signal testing of the component using a thermal head thermally coupled to the component holder. In an embodiment, the RF electrical signal testing of the component is carried out in multiple sequences, each sequence involving a translation of the test PCB/FPC with respect to the component FPC under test and a compression/release cycle of the clamping mechanism.

In a further embodiment, the present disclosure provides a method for the RF electrical signal testing of a component, the method including: receiving and retaining the component including a component FPC including component RF electrical signal contacts at a component holder of a fixturing assembly, where the fixturing assembly includes a test PCB or test FPC including test PCB/FPC RF electrical signal contacts (or landing pads); compressing the component RF electrical signal contacts into the test PCB/FPC RF electrical signal contacts using a clamping mechanism of the fixturing assembly; conducting RF electrical signal testing of the component; releasing the component RF electrical signal contacts from the test PCB/FPC RF electrical signal contacts using the clamping mechanism; translating the test PCB/FPC with respect to the component FPC; again compressing the component RF electrical signal contacts into the test PCB/FPC RF electrical signal contacts using the clamping mechanism; and again conducting RF electrical signal testing of the component.

It will be readily apparent to those of ordinary skill in the art that aspects and features of each of the described embodiments may be incorporated, omitted, and/or combined as desired in a given application, without limitation.

BRIEF DESCRIPTION OF THE DRAWINGS

The present disclosure is illustrated and described with reference to the various drawings, in which like reference numbers are used to denote like assembly components/method steps, as appropriate, and in which.

It will be readily apparent to those of ordinary skill in the art that aspects and features of each of the illustrated embodiments may be incorporated, omitted, and/or combined as desired in a given application, without limitation.

DETAILED DESCRIPTION

Again, the present disclosure provides a mechanical fixturing assembly and method for testing components with FPC interfaces that are coupled to high speed RF electrical connections, more permanently in operation, but more temporarily during testing, avoiding the use of solder, spring loaded pogo pins, stop blocks, etc. that may lead to FPC damage, are time consuming and labor intensive to implement, and are prone to signal integrity degradation. This fixturing assembly and method use a dry compression contact mechanism that couples the RF electrical contacts of the FPC to the RF electrical contacts of the RF electrical contacts of the PCB of the fixturing assembly in a temporary, robust, and high throughput manner. DC electrical connections may also be provided, as well as component thermal and humidity control, such that optimized testing conditions may be established.

Contact alignment is precisely controlled. The component and FPC and/or fixturing assembly and PCB may be aligned and realigned, such that RF signal switching is possible. This means that a reduced number of test heads and PCB channels can be utilized in some applications. Dry compression contact mechanism actuation and fixturing assembly alignment and realignment are implemented via computer control and a pneumatic, mechanical, or electromechanical stage, as well as robotic vision technologies, meaning that high throughput autonomous testing routines may be carried out without manual operator intervention.

Figure 1:
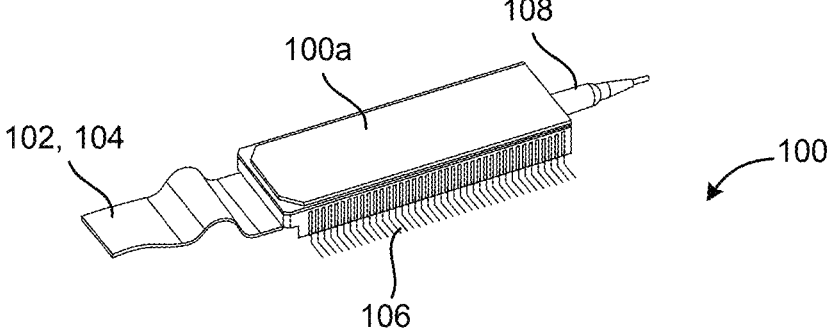
FIG. 1 illustrates example components that may be tested using the fixturing assembly and method of the present disclosure.
Figure 1:
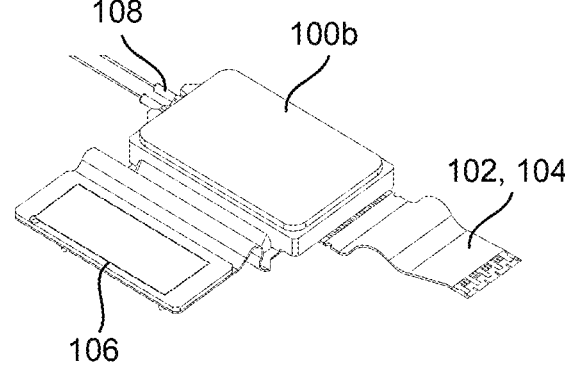

FIG. 1 illustrates example components 100 that may be tested using the fixturing assembly and method of the present disclosure. Specifically, a HB-CDM 100a and an ICR 100b are illustrated, each of which includes a FPC 102 with RF electrical connection contacts 104, optional DC electrical connection contacts 106, and optical connections 108. Such components 100, and similar components, are well known to those of ordinary skill in the art and are not described in greater detail, except that is often desirable to test the operation of the components 100 with appropriate RF signals and under controlled conditions in development and quality control scenarios.

Figure 2:
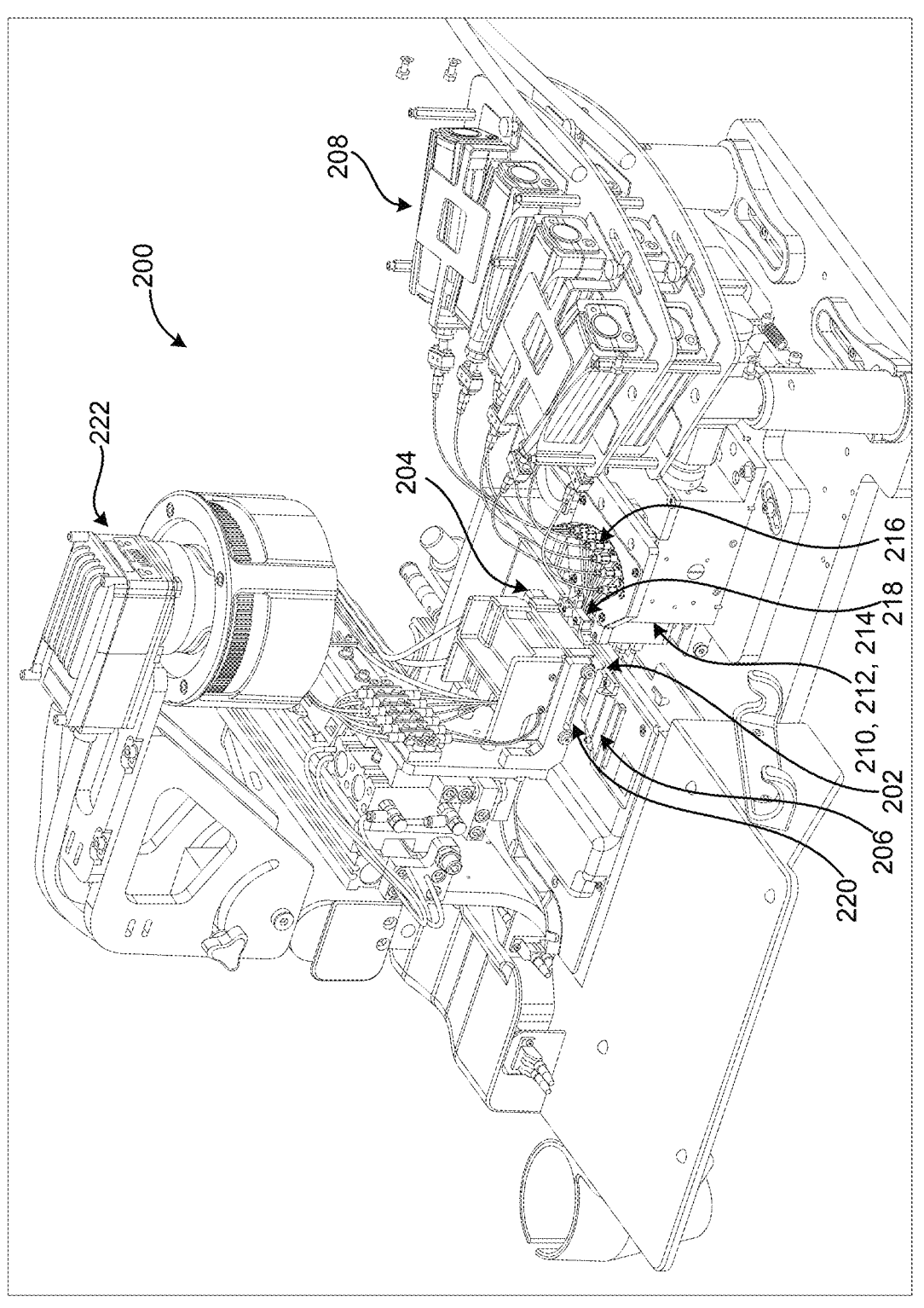
FIG. 2 illustrates one embodiment of the fixturing assembly of the present disclosure.

FIG. 2 illustrates one embodiment of the fixturing assembly 200 of the present disclosure. At the outset, it should be noted that the fixturing assembly 200 may include any number and manner of covers or support structures, not illustrated or described here for the sake of clarity. In general, the fixturing assembly 200 includes a component holder 202 that is configured to receive and secure the component 100 to the fixturing assembly 200 in a nested or clamped configuration. The fixturing assembly 200 also includes a thermal head 204 that is thermally coupled to the component holder 202 and component 100 and operable for heating/cooling the component holder 202 and component 100 to a desired temperature, which may be fixed or cycled, for example. This thermal head 204 may be liquid heated/ cooled, for example, and may include a condensation control mechanism. A DC electrical connector 206 is provided for making contact with the DC electrical connection contacts 106 of the component 100 to provide the component with DC electrical power, when applicable. A plurality of test heads 208 are provided for testing the operation of the component 100 by selectively applying RF electrical signals to/selectively receiving RF electrical signals from the component 100. Such test heads 208 are well known to those of ordinary skill in the art and are not described in greater detail. The RF electrical connection contacts 104 of the FPC 102 of the component 100 are electrically coupled to the plurality of test heads 208 via landing pads 210 and traces 212 disposed on a breakout PCB 214 (or breakout FPC 214) of the fixturing assembly 200 and a plurality of RF cables 216 that couple the landing pads 210/traces 212 to the plurality of test heads 208. Each of these aspects is described in greater detail below.

A clamping mechanism 218 is provided and selectively actuated to compress the RF electrical connection contacts 104 of the FPC 102 of the component 100 into the landing pads 210 of the PCB 214 when testing is performed, and release the RF electrical connection contacts 104 of the FPC 102 of the component 100 from the landing pads 210 of the PCB 214 when testing is completed, with a predetermined force that ensures that the FPC 102 is not worn or damaged. This aspect is also described in greater detail below.

A computer controlled motorized alignment stage 220 is provided to move the RF electrical connection contacts 104 of the FPC 102 of the component 100 with respect to the landing pads 210 of the PCB 214 when the clamping mechanism 218 is not actuated, and it is desirable that the clamping mechanism 218 not impinge on the alignment stage 220 such that the compression of the RF electrical connection contacts 104 of the FPC 102 of the component 100 into the landing pads 210 of the PCB 214 in not undesirably affected. This aspect is further described in greater detail below.

A camera assembly 222 is provided for controlling movement of the landing pads 210 of the PCB 214 with respect to the RF electrical connection contacts 104 of the FPC 102 of the component 100 when the clamping mechanism 218 is not actuated. Thus, contact alignment may be precisely controlled. The alignment stage 220, component 100, and FPC 102 and/or PCB 214 may be aligned and realigned, such that RF signal switching is possible. This means that a reduced number of test heads 208 and PCB channels can be utilized in some applications. All actions may be implemented using robotic vision technologies, meaning that high throughput autonomous testing routines may be carried out without manual operator intervention.

In general, the fixturing assembly allows for the very precise RF signal coupling of the FPC 102 and the PCB 214 during testing in a non-destructive manner in an automated high throughput process. Testing conditions can be controlled, including RF signal frequency, temperature, humidity, etc.

Figure 3:
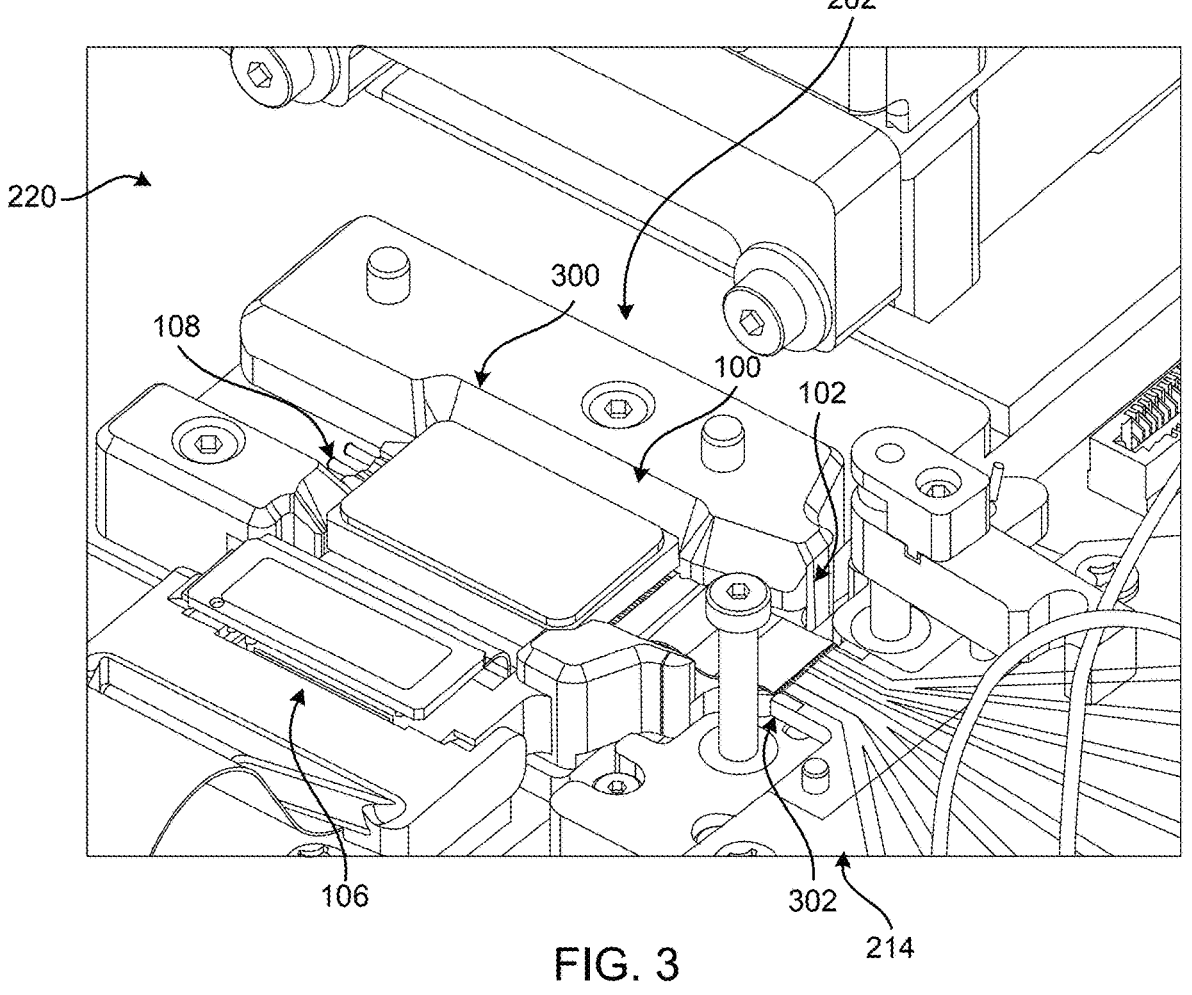
FIG. 3 illustrates one embodiment of the component holder of the fixturing assembly of the present disclosure.

FIG. 3 illustrates one embodiment of the component holder 202 of the fixturing assembly 200 of the present disclosure. Here, it can be seen that the component 100 is disposed and secured within a recess 300 formed in the component holder 202. Alternatively or in addition, the component 100 may be clamped or otherwise secured to the component holder 202. Cutouts or other pathways are provided for the FPC 102, the DC electrical connections 106, and the optical connections 108 of the component 100. The component holder 202 serves to hold the component 100 during testing such that the FPC/PCB interface 302 may be precisely aligned and held, in a releasable and non-destructive manner, for RF signal transmission between the FPC 102 and the PCB 214 with minimal RF signal degradation. The component holder 202 is coupled to the alignment stage 220 for precisely moving the FPC 102 relative to the PCB 214. Alternatively, the PCB 214 is coupled to the alignment stage 220 for precisely moving the PCB 214 relative to the FPC 102. In either case, the FPC/PCB interface 302 is aligned, established, held, and ultimately released. The DC electrical connections 106 may be made by one or more connectors, clips, pogo pins, and/or any other standard DC connection means.

Figure 4:
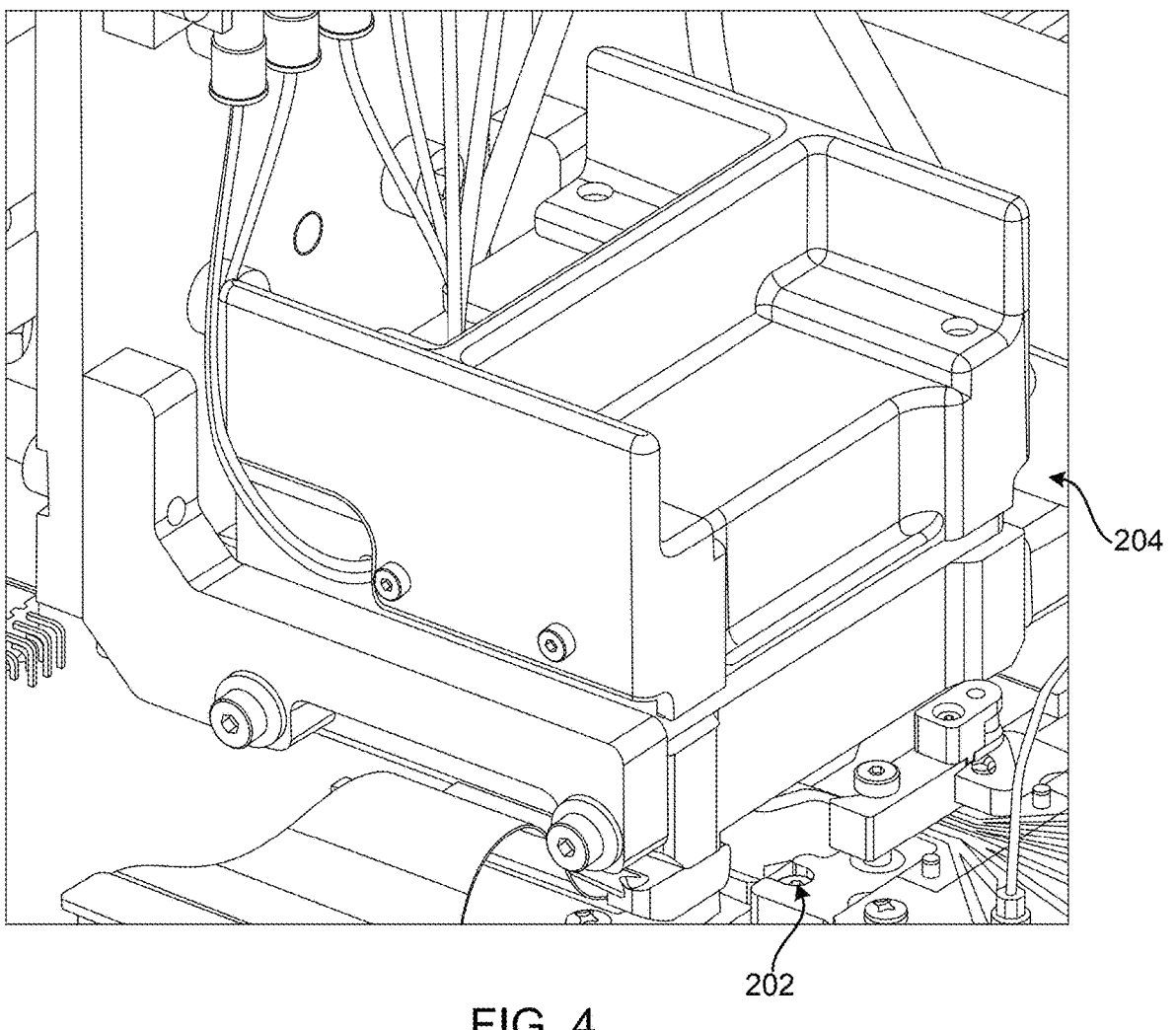
FIG. 4 illustrates one embodiment of the thermal head of the fixturing assembly of the present disclosure.

FIG. 4 illustrates one embodiment of the thermal head 204 of the fixturing assembly 200 of the present disclosure. The thermal head 204 is thermally coupled to the component holder 202 and component 100 and operable for heating/ cooling the component holder 202 and component 100 to a desired temperature, which may be fixed or cycled, for example. The thermal head 204 may be liquid heated/ cooled, for example, and may include a condensation control mechanism. For example, the temperature of the component 100 may be controlled by a thermoelectric cooler (TEC) with additional water or air cooling to transfer heat away from the component 100. This TEC may also be used for heating the component 100, but most components 100 sufficiently heat themselves, unless faster temperature ramping is desired.

Figure 5:
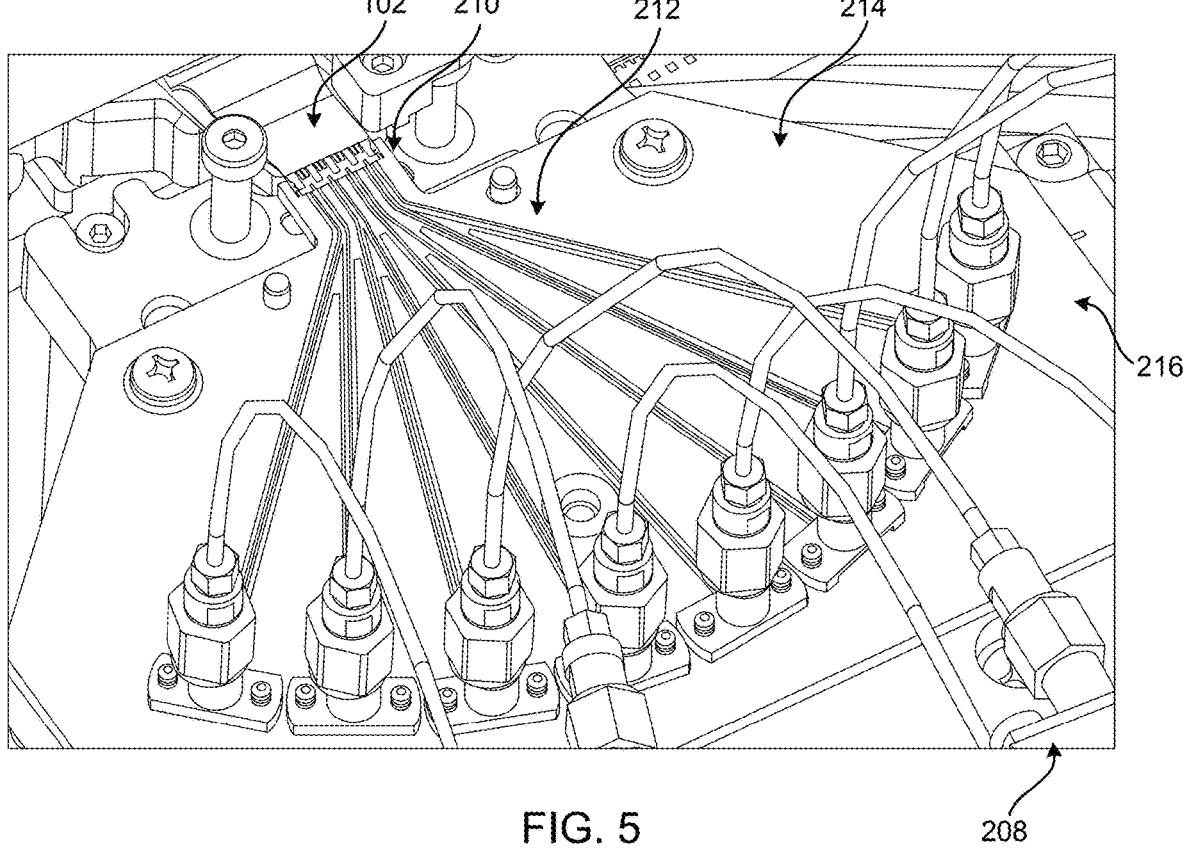
FIG. 5 illustrates one embodiment of the breakout PCB of the fixturing assembly of the present disclosure.

FIG. 5 illustrates one embodiment of the breakout PCB 214 of the fixturing assembly 200 of the present disclosure. The RF electrical connection contacts 104 of the FPC 102 of the component 100 are electrically coupled to the plurality of test heads 208 via the landing pads 210 and traces 212 disposed on the PCB 214 and the plurality of RF cables 216 that couple the landing pads 210/traces 212 to the plurality of test heads 208. It will be readily apparent to those of ordinary skill in the art that a FPC 214 may also be substituted for the PCB 214. Optionally, the PCB 214 may include integrated components, such as surface mount technology (SMT) components or the like, for testing in various RF frequency bands.

Figure 6:
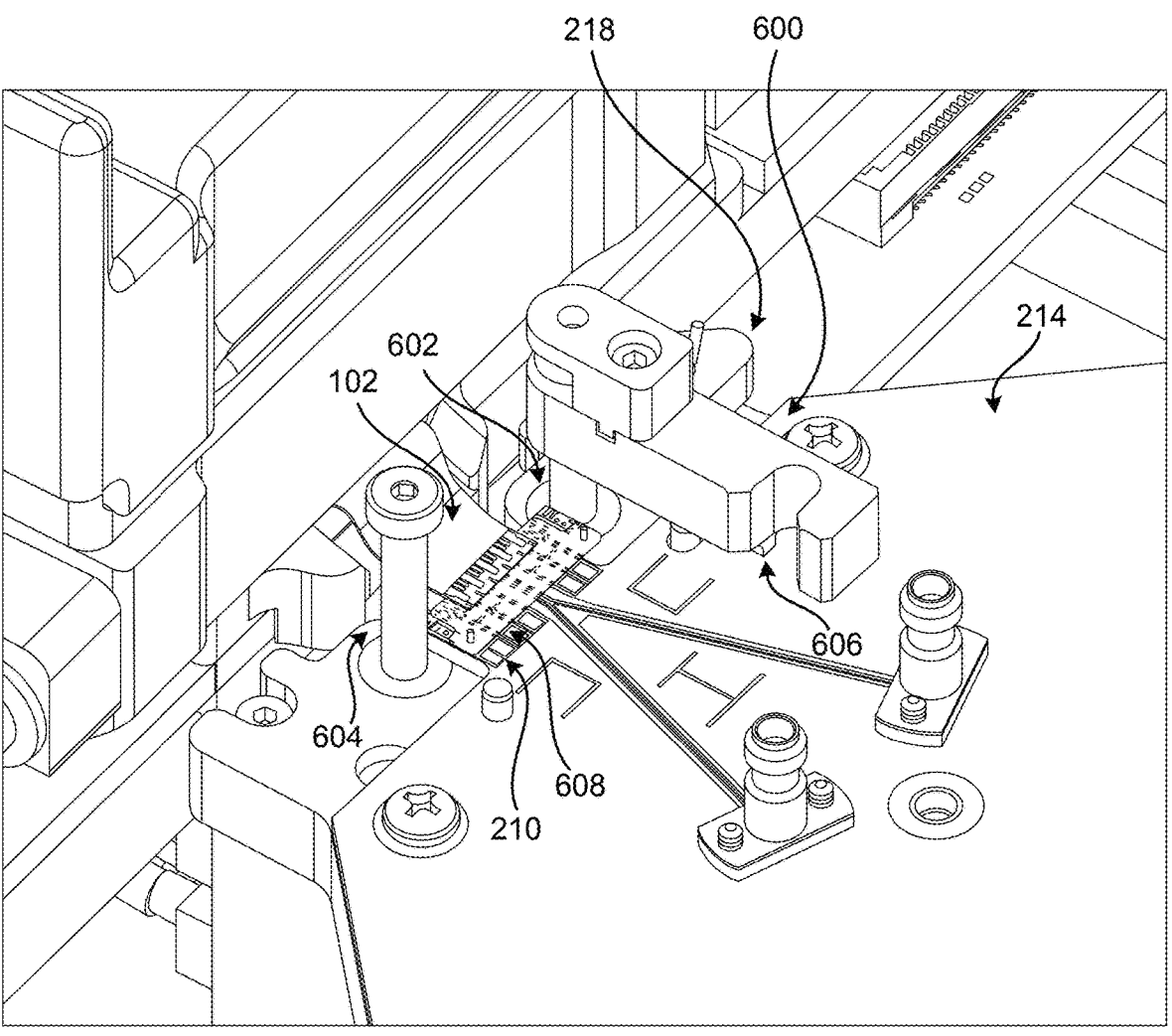
FIG. 6 illustrates one embodiment of the clamping mechanism of the fixturing assembly of the present disclosure in a disengaged configuration.
Figure 7:
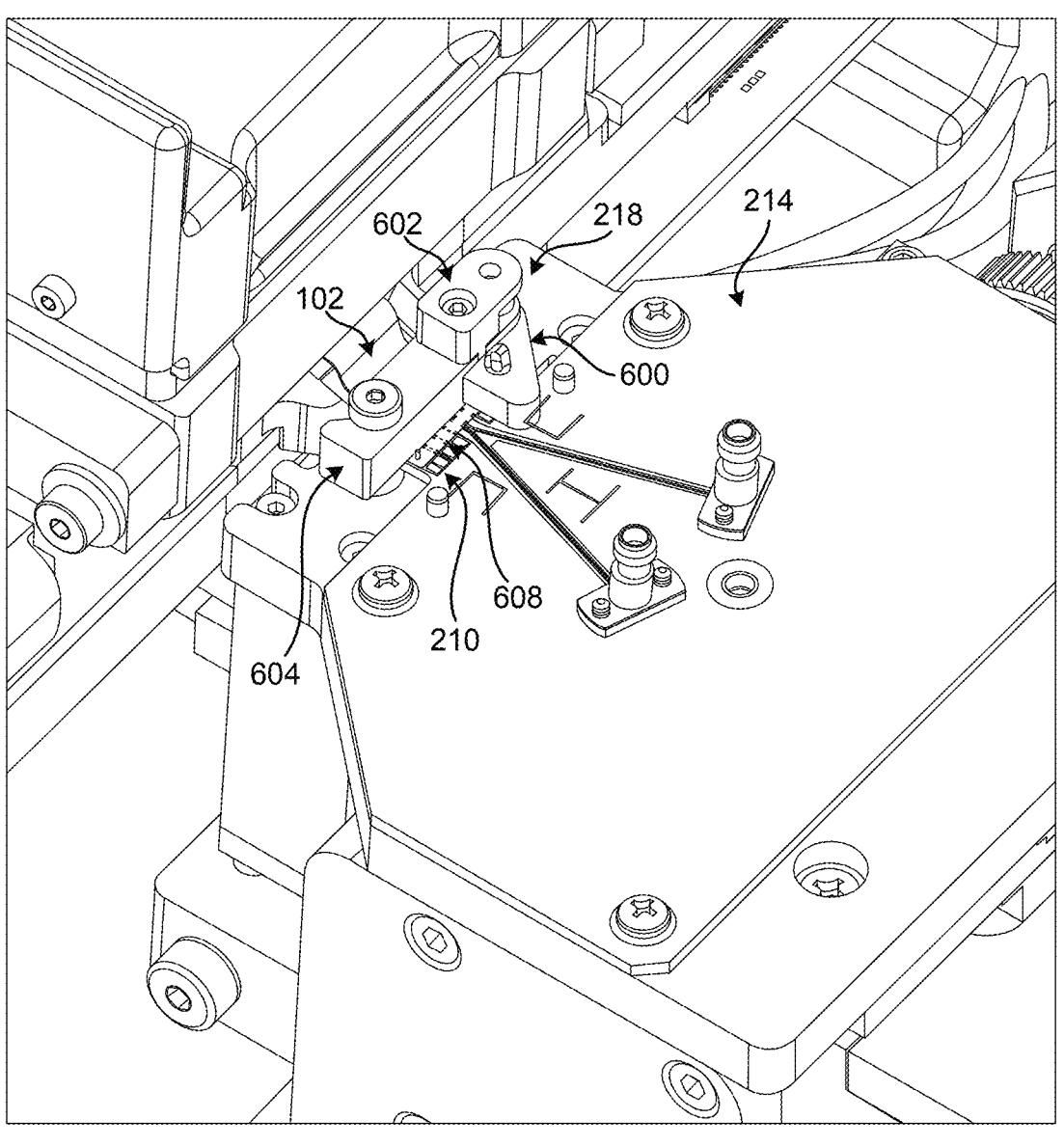
FIG. 7 illustrates one embodiment of the clamping mechanism of the fixturing assembly of the present disclosure in an engaged configuration.
Figure 8:
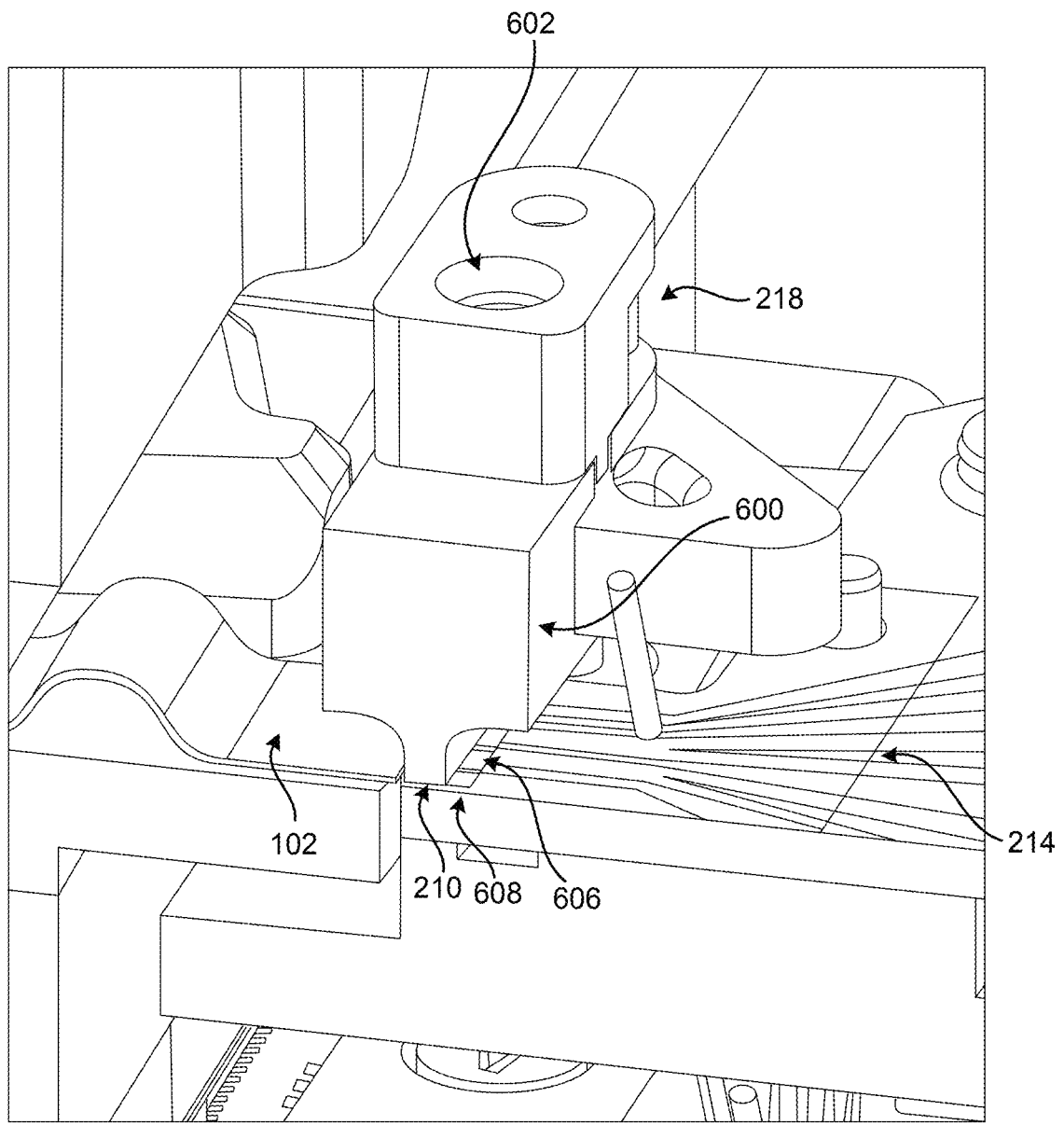
FIG. 8 also illustrates one embodiment of the clamping mechanism of the fixturing assembly of the present disclosure in the engaged configuration.

FIGS. 6-8 illustrate one embodiment of the clamping mechanism 218 of the fixturing assembly 200 of the present disclosure in disengaged and engaged configurations. In the disengaged configuration, the clamping mechanism 218 is opened to allow the component 100 and FPC 102 to be manipulated (e.g., placed or removed) adjacent to the landing pads 210 of the PCB 214. In the engaged configuration, the clamping mechanism is closed and actuated to compress the FPC 102 against the landing pads 210 of the PCB 214 for testing. In the embodiment illustrated, the clamping mechanism 218 includes a clamping arm 600 that pivots with or about a first shaft 602 of the fixturing assembly 200 on one side of the FPC 102. The clamping mechanism 218 is actuated to pivot the clamping arm 600 over the FPC 102. When pivoted over the FPC 102, an end of the clamping arm 600 opposing the first shaft 602 hooks or otherwise engages a second shaft 604 of the fixturing assembly, which may be a post with a head 606, on the opposite side of the FPC 102. The clamping mechanism 218 is then further actuated to translate the clamping arm 600 into the FPC 102, thereby compressing the FPC 102 against the landing pads 210 of the PCB 214 to connect the RF signal paths of the component 100 and the PCB 214. This translation of the clamping arm 600 may be via retraction of the first shaft 602 and/or the second shaft 604 towards the FPC 102 and PCB 214. All actuation motions may be accomplished via pneumatic, mechanical, and/or electromechanical means. The clamping arm 600 includes a rail structure 606 disposed along a bottom surface thereof that actually engages the FPC 102 to compress the FPC 102 against the landing pads 210 of the PCB 214. This rail structure 606 may be integrally formed with or otherwise coupled to the clamping arm 600, and may be made of the same or a different material, such as a more compliant material that serves to protect the FPC 102 during compression. It will be readily apparent to those of ordinary skill in the art that other clamping mechanisms 218 that accomplish the same compression function may also be used as alternatives.

Optionally, an interposer material 608 may be disposed between the FPC 102 and the landing pads 210 of the PCB 214 to cushion the conductive FPC/PCB interface 302, and/or to provide electrical contact only when a predetermined degree of contact force is provided between the FPC 102 and the landing pads 210 of the PCB 214. For example, the interposer material 608 may be an insulative elastomer layer with embedded conductive beads. This provides cushioning under lower forces when only the insulative elastomer layer is contacted by the FPC 102 and the landing pads 210 of the PCB 214, but provides electrical conductivity under higher forces when the embedded conductive beads are contacted by the FPC 102 and the landing pads 210 of the PCB 214. In such a case, the interposer material 608 acts like a switch that is actuated by the compressive force of the clamping arm 600.

Figure 9:
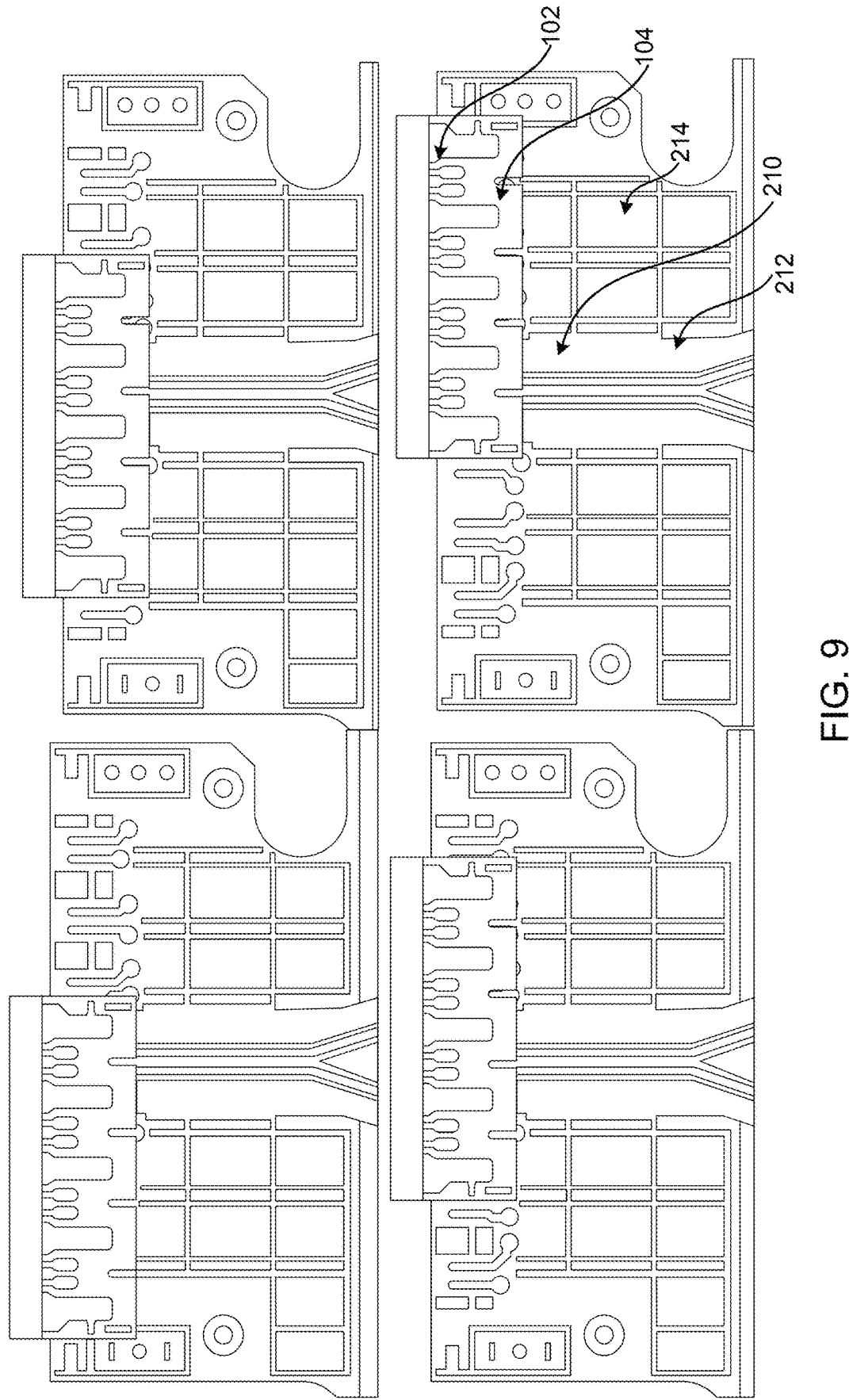
FIG. 9 also illustrates one embodiment of the breakout PCB of the fixturing assembly of the present disclosure.

FIG. 9 further illustrates one embodiment of the breakout PCB 214 of the fixturing assembly 200 of the present disclosure. In some situations, it is desirable to inject RF signals on all RF channels of the component 100. Typical components 100 have 8 RF outputs or 8 RF inputs. For some components 100, the equipment that is needed for high frequency testing is very costly (e.g., vector network analyzers (VNAs), fast calibrated photoreceivers, etc.) and typically does not have more than 4 RF channels, which imposes the use of RF switching or manual intervention during the testing flow, which is undesirable in volume manufacturing. This is problematic as RF switching is typically not yet available at all frequencies targeted (e.g., DC to 100 GHz). Thus, the fixturing assembly 200 may utilize a 2 RF channel PCB 214, for example, that is moved by the computer controlled motorized alignment stage 220 during the testing sequence (in an automated manner according to a predefined algorithm) to test the different RF channels of an 8 RF channel component 100, for example, in sequence, without manual intervention. This also adds the benefit of shorter RF traces 212 in the PCB 214, which increases the signal levels reaching the test heads 208 and allows test time reduction via reduced averaging. As is illustrated in FIG. 9, the PCB 214 (or the FPC 102) may be translated such that different subsets of the RF electrical contacts 104 sequentially contact the landing pads 210 of the PCB 214. Thus, for example, 2 PCB RF channels can be used to sequentially probe 8 FPC RF channels. In this manner, the clamping mechanism 218 and alignment stage 220 can be used to replicate the use of a high speed RF switch at RF frequencies where RF switching is not typically commercialized (e.g., higher than 100 GHz). For high speed RF, the testing equipment to connect all RF channels simultaneously may be prohibitively expensive and difficult to come by. A conventional solution is to use an RF switch, which may add undesirable noise, complexity and cost to the setup, and is not readily available for high speed RF at the frequencies targeted.

Figure 10:
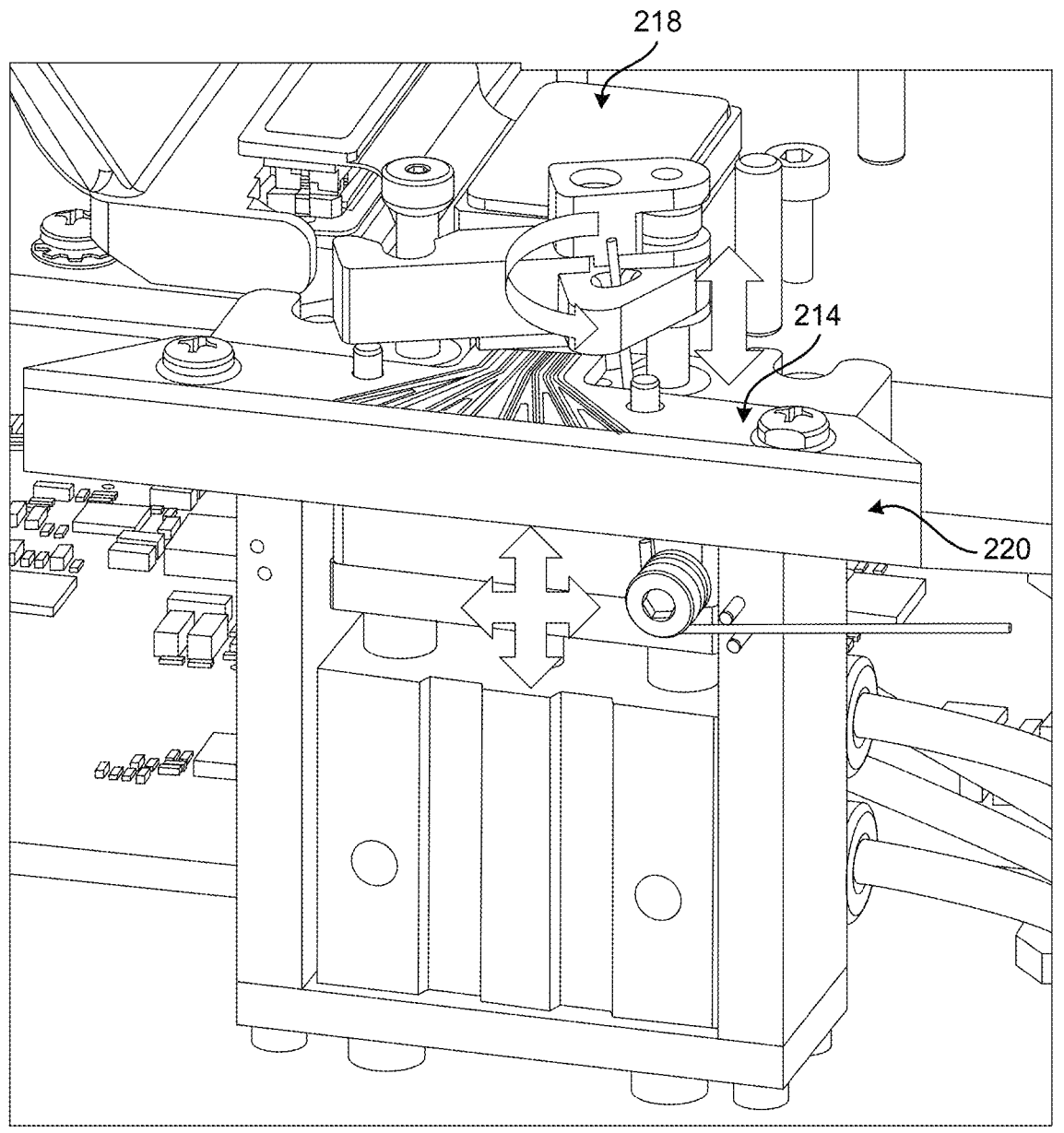
FIG. 10 illustrates one embodiment of the alignment stage of the fixturing assembly of the present disclosure.

FIG. 10 illustrates one embodiment of the alignment stage 220 of the fixturing assembly 200 of the present disclosure. As illustrated, the alignment stage 220 allows the PCB 214 to be moved with respect to the FPC 102, one or more of laterally, longitudinally, and vertically, independent of and without being acted upon by the clamping mechanism 218 when it pivots and retracts/releases. Alternatively, the alignment stage 220 may allow the FPC 102 to be moved with respect to the PCB 214. The active alignment of the fixturing assembly 200 provides well aligned contact so that high speed RF signals can be transmitted without degradation even if the shape of the FPC 102 varies from component 100 to component 100, providing high speed RF contact points between the FPC 102 and the PCB 214 with micron level precision. With this active alignment the PCB 214 can be aligned for every component 100 to remove FPC shape tolerance (which could be 1-2 mm as the shape relaxes over time) and still provide such micron level precision in a repeatable manner. The clamping mechanism 218 provides high clamping force without the clamping force being directly applied on the alignment stage 220 (e.g., the clamping force can be 10 lbf even if the alignment stage 220 has a weight limit of 1 lbf), such that precision and accuracy are not affected while clamped. The clamping mechanism 218 may use a spring lever pivoting mechanism that automatically ensures that the clamping arm 600 opens/shuts at the correct time every time. The linear motion actuator allows both rotational and linear motion.

In general, the fixturing assembly 200 of the present disclosure allows for the testing of a finished component 100 with little risk of damage to the component 100 as the RF electrical connection may be aligned and clamped precisely without the FPC 102 being slid on the PCB 214, which could cause stress and/or damage. Because soldering is no longer required, the FPC 102 is not subjected to possible heat and mechanical damage. RF connection and switching is automated via motorized linear translation, enabling higher testing throughput.

Figure 11:
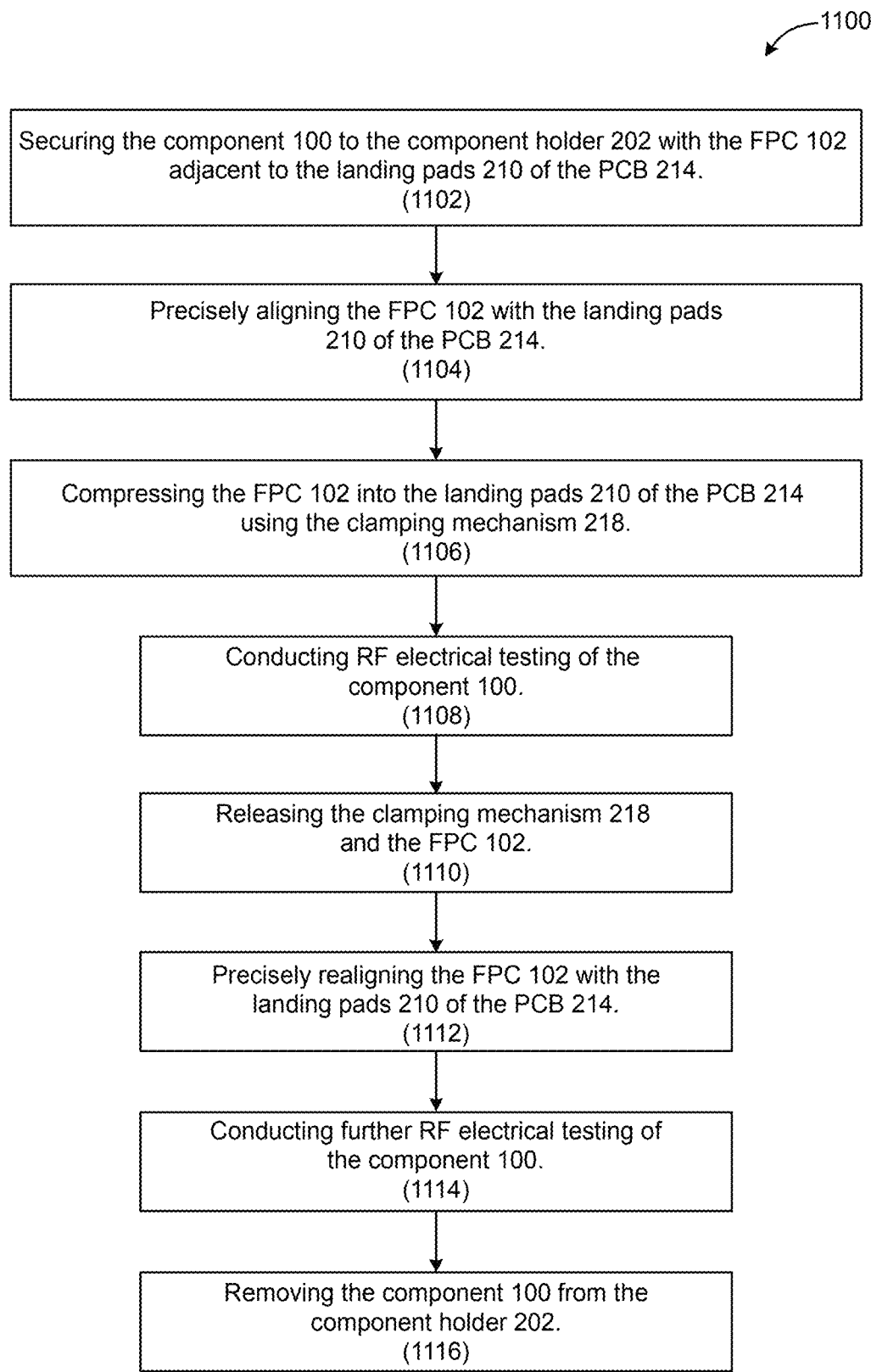
FIG. 11 illustrates one embodiment of the fixturing method of the present disclosure.

FIG. 11 illustrates one embodiment of the fixturing method of the present disclosure. The fixturing method 1100 first includes securing the component 100 to the component holder 202, such as by disposing and securing the component 100 within the recess 300 formed in the component holder 202, with the FPC 102 adjacent to the landing pads 210 of the PCB 214 (step 1102). Under guidance of the camera assembly 222 and using the alignment stage 220, the method 1100 then includes precisely aligning the FPC 102 with the landing pads 210 of the PCB 214 (step 1104). The method 1100 then includes compressing the FPC 102 into the landing pads 210 of the PCB 214 using the clamping mechanism 218 (step 1106), and conducting RF electrical testing of the component 100 (step 1108). If additional RF electrical testing is required, the method 1100 then includes releasing the clamping mechanism 218 and the FPC 102 (step 1110), and precisely realigning the FPC 102 with the landing pads 210 of the PCB 214 (step 1112), representing a RF channel switching procedure. The method 1110 then includes conducting further RF electrical testing of the component 100 (step 1114). Finally, the method 1100 includes removing the component 100 from the component holder 202 (step 1116).

Thus, again, the present disclosure provides a mechanical fixturing assembly and method for testing components with FPC interfaces that are coupled to high speed RF electrical connections, more permanently in operation, but more temporarily during testing, avoiding the use of solder, spring loaded pogo pins, stop blocks, etc. that may lead to FPC damage, are time consuming and labor intensive to implement, and are prone to signal integrity degradation. This fixturing assembly and method use a dry compression contact mechanism that couples the RF electrical contacts of the FPC to the RF electrical contacts of the PCB of the fixturing assembly in a temporary, robust, and high throughput manner. DC electrical connections may also be provided, as well as component thermal and humidity control, such that optimized testing conditions may be established.

Contact alignment is precisely controlled. The component and FPC and/or fixturing assembly and PCB may be aligned and realigned, such that RF signal switching is possible. This means that a reduced number of test heads and PCB channels can be utilized in some applications. Dry compression contact mechanism actuation and fixturing assembly alignment and realignment are implemented via computer control and a pneumatic, mechanical, or electromechanical stage, as well as robotic vision technologies, meaning that high throughput autonomous testing routines may be carried out without manual operator intervention.

Although the present disclosure is illustrated and described with reference to specific embodiments and examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following non-limiting claims for all purposes.

What is claimed is:

1. A fixturing assembly comprising:
a component holder adapted to receive and retain a component comprising a component flexible printed circuit comprising component radio frequency electrical signal contacts;
one of a test printed circuit board or a test flexible printed circuit comprising test radio frequency electrical signal contacts; and
a clamping mechanism adapted to be actuated to compress the component radio frequency electrical signal contacts into the test radio frequency electrical signal contacts during radio frequency electrical signal testing of the component by compressing the component flexible printed circuit.

2. The fixturing assembly of claim 1, wherein the component holder defines a recess adapted to receive and retain the component.

3. The fixturing assembly of claim 1, further comprising a direct current electrical connection adapted to contact a direct current electrical contact of the component adjacent to or through the component holder.

4. The fixturing assembly of claim 1, further comprising radio frequency test heads coupled to the test radio frequency electrical signal contacts and adapted to perform the radio frequency electrical signal testing of the component.

5. The fixturing assembly of claim 1, further comprising a computer controlled motorized alignment stage adapted to translate the one of the test printed circuit board or the test flexible printed circuit with respect to the component flexible printed circuit to align the test radio frequency electrical signal contacts with respect to the component radio frequency electrical signal contacts for radio frequency signal transmission between the test printed circuit board or the test flexible printed circuit and the component flexible printed circuit, wherein the clamping mechanism does not deflect the alignment stage.

6. The fixturing assembly of claim 5, wherein the alignment of the test radio frequency electrical signal contacts with respect to the component radio frequency electrical signal contacts is controlled by a computer controller and a camera assembly utilizing an automated computer vision algorithm.

7. The fixturing assembly of claim 1, wherein the clamping mechanism comprises a clamping arm that is selectively actuated one or more of linearly and pivotably to be disposed adjacent to an interface between the component radio frequency electrical signal contacts and the test radio frequency electrical signal contacts and to compress the component radio frequency electrical signal contacts into the test radio frequency electrical signal contacts during the radio frequency electrical signal testing of the component.

8. The fixturing assembly of claim 1, wherein an interposer material is disposed between the component radio frequency electrical signal contacts and the test radio frequency electrical signal contacts during the radio frequency electrical signal testing of the component.

9. The fixturing assembly of claim 1, further comprising a thermal head thermally coupled to the component holder and adapted to control a temperature of the component holder and the component during the radio frequency electrical signal testing of the component.

10. The fixturing assembly of claim 1, wherein a number of the component radio frequency electrical signal contacts is greater than a number of the test radio frequency electrical signal contacts such that the radio frequency electrical signal testing of the component is carried out in successive compression/release cycles of the clamping mechanism, with the one of the test printed circuit board or the test flexible printed circuit translated with respect to the component flexible printed circuit to align/realign the test radio frequency electrical signal contacts with respect to the component radio frequency electrical signal contacts between the compression/release cycles of the clamping mechanism.

11. A method for the radio frequency electrical signal testing of a component, the method comprising:
receiving and retaining the component comprising a component flexible printed circuit comprising component radio frequency electrical signal contacts at a component holder of a fixturing assembly, wherein the fixturing assembly comprises one of a test printed circuit board or a test flexible printed circuit comprising test radio frequency electrical signal contacts;
compressing the component radio frequency electrical signal contacts into the test radio frequency electrical signal contacts by compressing the component flexible printed circuit using a clamping mechanism of the fixturing assembly; and conducting radio frequency electrical signal testing of the component.

12. The method of claim 11, further comprising contacting a direct current electrical contact of the component with a direct current electrical connection of the fixturing assembly adjacent to or through the component holder.

13. The method of claim 11, wherein the radio frequency electrical signal testing of the component is conducted using radio frequency test heads coupled to the test radio frequency electrical signal contacts.

14. The method of claim 11, further comprising translating the one of the test printed circuit board or the test flexible printed circuit with respect to the component flexible printed circuit to align the test radio frequency electrical signal contacts with respect to the component radio frequency electrical signal contacts for radio frequency signal transmission between the test printed circuit board or the test flexible printed circuit and the component flexible printed circuit using a computer controlled motorized alignment stage of the fixturing assembly, wherein the clamping mechanism does not deflect the alignment stage.

15. The method of claim 14, wherein the alignment of the test radio frequency electrical signal contacts with respect to the component radio frequency electrical signal contacts is controlled by a computer controller and a camera assembly of the fixturing assembly utilizing an automated computer vision algorithm.

16. The method of claim 11, wherein the clamping mechanism comprises a clamping arm that is selectively actuated one or more of linearly and pivotably to be disposed adjacent to an interface between the component radio frequency electrical signal contacts and the test radio frequency electrical signal contacts and to compress the component radio frequency electrical signal contacts into the test radio frequency electrical signal contacts during the radio frequency electrical signal testing of the component.

17. The method of claim 11, wherein an interposer material is disposed between the component radio frequency electrical signal contacts and the test radio frequency electrical signal contacts during the radio frequency electrical signal testing of the component.

18. The method of claim 11, further comprising controlling a temperature of the component holder and the component during the radio frequency electrical signal testing of the component using a thermal head thermally coupled to the component holder.

19. The method of claim 11, wherein a number of the component radio frequency electrical signal contacts is greater than a number of the test radio frequency electrical signal contacts such that the radio frequency electrical signal testing of the component is carried out in successive compression/release cycles of the clamping mechanism, with the one of the test printed circuit board or the test flexible printed circuit translated with respect to the component flexible printed circuit to align/realign the test radio frequency electrical signal contacts with respect to the component radio frequency electrical signal contacts between the compression/release cycles of the clamping mechanism.

20. A method for the radio frequency electrical signal testing of a component, the method comprising:

receiving and retaining the component comprising a component flexible printed circuit comprising component radio frequency electrical signal contacts at a component holder of a fixturing assembly, wherein the fixturing assembly comprises one of a test printed circuit board or a test flexible printed circuit comprising test radio frequency electrical signal contacts;

compressing at least some of the component radio frequency electrical signal contacts into the test radio frequency electrical signal contacts using a clamping mechanism of the fixturing assembly;

conducting radio frequency electrical signal testing of the component;

releasing the at least some of the component radio frequency electrical signal contacts from the test radio frequency electrical signal contacts using the clamping mechanism;

translating the one of the test printed circuit board or the test flexible printed circuit with respect to the component flexible printed circuit to align the test radio frequency electrical signal contacts with respect to other of the component radio frequency electrical signal contacts;

compressing the other of the component radio frequency electrical signal contacts into the test radio frequency electrical signal contacts using the clamping mechanism; and again conducting radio frequency electrical signal testing of the component.

* * * * *